(12) United States Patent
Scheuerlein et al.

(10) Patent No.: US 7,499,355 B2
(45) Date of Patent: *Mar. 3, 2009

(54) HIGH BANDWIDTH ONE TIME FIELD-PROGRAMMABLE MEMORY

(75) Inventors: Roy E. Scheuerlein, Cupertino, CA (US); Christopher J. Petti, Mountain View, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/461,410

(22) Filed: Jul. 31, 2006

(65) Prior Publication Data

US 2008/0025061 A1    Jan. 31, 2008

(51) Int. Cl.
*G11C 11/00* (2006.01)
(52) U.S. Cl. .................................. 365/201; 365/94
(58) Field of Classification Search ............. 365/94, 365/201
See application file for complete search history.

(56) References Cited

U.S. PATENT DOCUMENTS

| | | | |
|---|---|---|---|
| 4,698,589 A * | 10/1987 | Blankenship et al. | ....... 365/201 |
| 5,389,475 A | 2/1995 | Yanagisawa et al. | |
| 5,640,343 A | 6/1997 | Gallagher et al. | |
| 5,818,749 A | 10/1998 | Harshfield | |
| 5,978,277 A | 11/1999 | Hsu et al. | |
| 6,034,882 A | 3/2000 | Johnson et al. | |
| 6,306,718 B1 | 10/2001 | Singh et al. | |
| 6,420,215 B1 | 7/2002 | Knall et al. | |
| 6,483,734 B1 | 11/2002 | Sharma et al. | |

(Continued)

FOREIGN PATENT DOCUMENTS

EP    1426971 A    6/2004

(Continued)

OTHER PUBLICATIONS

International Search Report & The Written Opinion of the International Searching Authority, Patent Cooperation Treaty, Application No. PCT/US2007/074520, Dec. 12, 2007.

(Continued)

*Primary Examiner*—Michael T Tran
(74) *Attorney, Agent, or Firm*—Vierra Magen Marcus & DeNiro LLP

(57) ABSTRACT

A one-time field programmable (OTP) memory cell with related manufacturing and programming techniques is disclosed. An OTP memory cell in accordance with one embodiment includes at least one resistance change element in series with a steering element. The memory cell is field programmed using a reverse bias operation that can reduce leakage currents through the array as well as decrease voltage levels that driver circuitry must normally produce in program operations. An array of memory cells can be fabricated by switching the memory cells from their initial virgin state to a second resistance state during the manufacturing process. In one embodiment, the factory switching operation can include popping an anti-fuse of each memory cell to set them into the second resistance state. The array of memory cells in the second resistance state are provided to an end-user. Control circuitry is also provided with the memory array that can switch the resistance of selected cells back toward their initial resistance state to program the array in accordance with data received from a user or host device.

24 Claims, 13 Drawing Sheets

U.S. PATENT DOCUMENTS

| | | |
|---|---|---|
| 6,567,287 B2 | 5/2003 | Scheuerlein |
| 6,795,338 B2 | 9/2004 | Parkinson et al. |
| 6,856,536 B2 | 2/2005 | Rinerson et al. |
| 6,856,572 B2 | 2/2005 | Scheuerlein et al. |
| 6,862,213 B2 | 3/2005 | Hamaguchi |
| 6,873,561 B2 | 3/2005 | Ooishi |
| 6,879,505 B2 | 4/2005 | Scheuerlein |
| 6,891,749 B2 | 5/2005 | Campbell et al. |
| 6,952,030 B2 | 10/2005 | Herner et al. |
| 6,984,561 B2 | 1/2006 | Herner et al. |
| 7,005,350 B2 | 2/2006 | Walker et al. |
| 7,054,219 B1 | 5/2006 | Petti et al. |
| 7,057,922 B2 | 6/2006 | Fukumoto |
| 7,167,387 B2 | 1/2007 | Sugita et al. |
| 7,221,579 B2 | 5/2007 | Krusin-Elbaum et al. |
| 7,236,390 B1 | 6/2007 | Chang et al. |
| 7,372,725 B2 | 5/2008 | Philipp et al. |
| 2003/0001230 A1 | 1/2003 | Lowrey |
| 2003/0002332 A1 | 1/2003 | Lowrey |
| 2003/0073262 A1 | 4/2003 | Xu |
| 2003/0173612 A1 | 9/2003 | Krieger et al. |
| 2003/0218904 A1 | 11/2003 | Lowrey |
| 2004/0109377 A1 | 6/2004 | Ooishi |
| 2004/0114419 A1 | 6/2004 | Lowrey et al. |
| 2004/0129952 A1* | 7/2004 | Griesmer et al. ............ 257/202 |
| 2004/0160818 A1 | 8/2004 | Rinerson |
| 2004/0228159 A1 | 11/2004 | Kostylev et al. |
| 2004/0257882 A1* | 12/2004 | Stackhouse et al. .... 365/189.09 |
| 2004/0264234 A1 | 12/2004 | Moore et al. |
| 2005/0018509 A1 | 1/2005 | Hush et al. |
| 2005/0052915 A1 | 3/2005 | Herner et al. |
| 2005/0098800 A1 | 5/2005 | Herner et al. |
| 2005/0121742 A1 | 6/2005 | Petti |
| 2005/0158950 A1 | 7/2005 | Scheuerlein et al. |
| 2005/0162883 A1 | 7/2005 | Nejad et al. |
| 2005/0167699 A1 | 8/2005 | Sugita et al. |
| 2005/0226067 A1 | 10/2005 | Herner et al. |
| 2006/0023532 A1 | 2/2006 | Hush et al. |
| 2006/0067117 A1 | 3/2006 | Petti |
| 2006/0071298 A1 | 4/2006 | Hui |
| 2006/0091373 A1 | 5/2006 | Lee et al. |
| 2006/0109704 A1 | 5/2006 | Seo et al. |
| 2006/0157679 A1 | 7/2006 | Scheuerlein |
| 2006/0157682 A1 | 7/2006 | Scheuerlein |
| 2006/0160307 A1 | 7/2006 | Joo et al. |
| 2006/0171194 A1* | 8/2006 | Lowrey et al. ............... 365/154 |
| 2006/0221734 A1* | 10/2006 | Bedeschi et al. ............ 365/201 |
| 2006/0250836 A1 | 11/2006 | Herner et al. |
| 2006/0250837 A1 | 11/2006 | Herner et al. |
| 2006/0273298 A1* | 12/2006 | Petti ............................ 257/5 |
| 2007/0002610 A1 | 1/2007 | Knall |
| 2007/0069276 A1 | 3/2007 | Scheuerlein et al. |
| 2007/0070690 A1 | 3/2007 | Scheuerlein et al. |
| 2007/0072360 A1 | 3/2007 | Kumar et al. |
| 2007/0090425 A1 | 4/2007 | Kumar et al. |
| 2007/0114509 A1 | 5/2007 | Herner et al. |
| 2007/0165442 A1 | 7/2007 | Hosoi et al. |
| 2007/0268742 A1 | 11/2007 | Liu |
| 2008/0025066 A1 | 1/2008 | Fasoli et al. |
| 2008/0025068 A1 | 1/2008 | Scheuerlein et al. |
| 2008/0025069 A1 | 1/2008 | Scheuerlein et al. |
| 2008/0025076 A1 | 1/2008 | Scheuerlein et al. |
| 2008/0025077 A1 | 1/2008 | Scheuerlein et al. |
| 2008/0025078 A1 | 1/2008 | Scheuerlein et al. |
| 2008/0025085 A1 | 1/2008 | Scheuerlein et al. |
| 2008/0025088 A1 | 1/2008 | Scheuerlein et al. |
| 2008/0025089 A1 | 1/2008 | Scheuerlein et al. |
| 2008/0025093 A1 | 1/2008 | Scheuerlein et al. |
| 2008/0025094 A1 | 1/2008 | Scheuerlein et al. |
| 2008/0025118 A1 | 1/2008 | Scheuerlein |
| 2008/0025131 A1 | 1/2008 | Scheuerlein et al. |
| 2008/0025132 A1 | 1/2008 | Fasoli et al. |
| 2008/0025133 A1 | 1/2008 | Scheuerlein et al. |
| 2008/0025134 A1 | 1/2008 | Scheuerlein et al. |

FOREIGN PATENT DOCUMENTS

| | | |
|---|---|---|
| EP | 1755126 A | 2/2007 |
| WO | WO03/085675 A | 10/2003 |
| WO | WO2006/039370 A2 | 4/2006 |
| WO | WO2006/121837 A | 11/2006 |
| WO | WO2007/038665 A | 4/2007 |

OTHER PUBLICATIONS

Non-Final Office Action, United States Patent & Trademark Office, U.S. Appl. No. 11/461,424, filed on Jul. 31, 2006, Aug. 9, 2007.

U.S. Appl. No. 11/461,419, filed on Jul. 31, 2006, entitled "Systems For High Bandwidth One Time Field-Programmable Memory,".

Non-Final Office Action, United States Patent & Trademark Office, U.S. Appl. No. 11/461,419, filed Jul. 31, 2006, May 9, 2008.

Response to Non-Final Office Action, U.S. Appl. No. 11/461,419, filed Jul. 31, 2006, Aug. 11, 2008.

Notice of Allowance and Fee(s) Due, United States Patent & Trademark Office, U.S. Appl. No. 11/461,419, filed Jul. 31, 2006, Oct. 15, 2008.

* cited by examiner

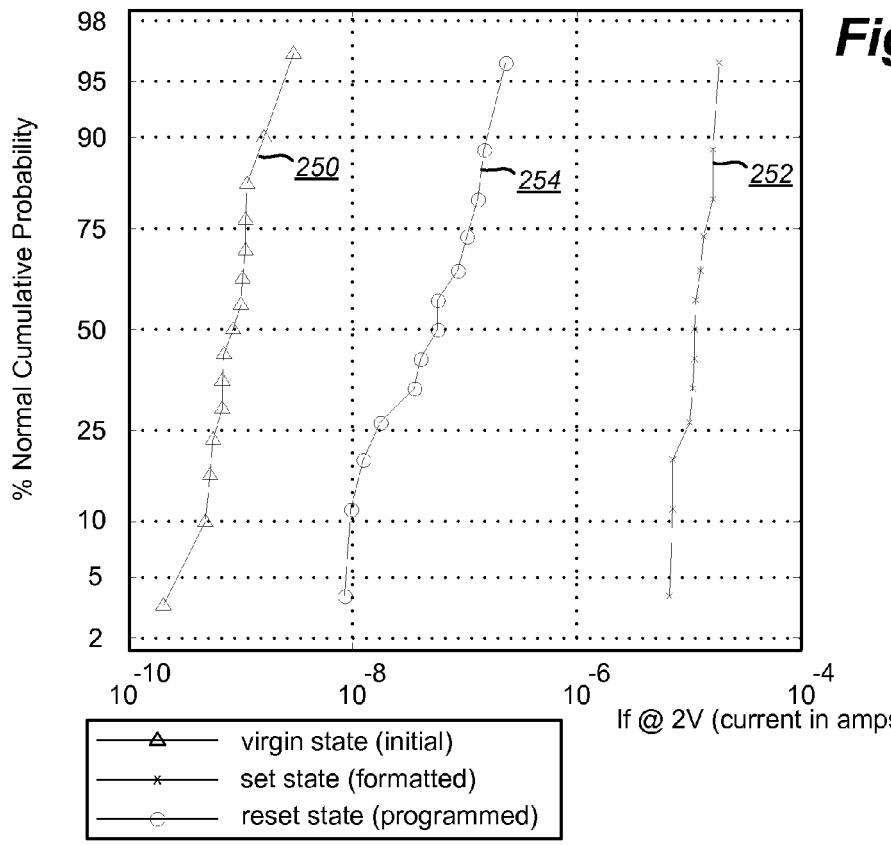

Figure 6

- △ virgin state (initial)
- × set state (formatted)
- ○ reset state (programmed)

Figure 7

| physical state 260 | logical state 262 | state transition 264 | bias conditions 266 | location of operation 268 |
|---|---|---|---|---|
| initial (virgin) | none | no transition - virgin state | no bias – virgin state | no operation – virgin state |
| formatted (set) | '1' | highest resistance initial state to lowest resistance formatted state | large forward bias to pop antifuse – e.g., +12V applied to selected BL | factory setting – incomplete on-chip circuitry for operation |
| programmed (reset) | '0' | lowest resistance formatted state to higher resistance reset state | reverse bias to increase cell resistance – e.g., -6V on selected BL and +6V on selected WL | field programmable – on-chip circuitry to apply reverse bias |

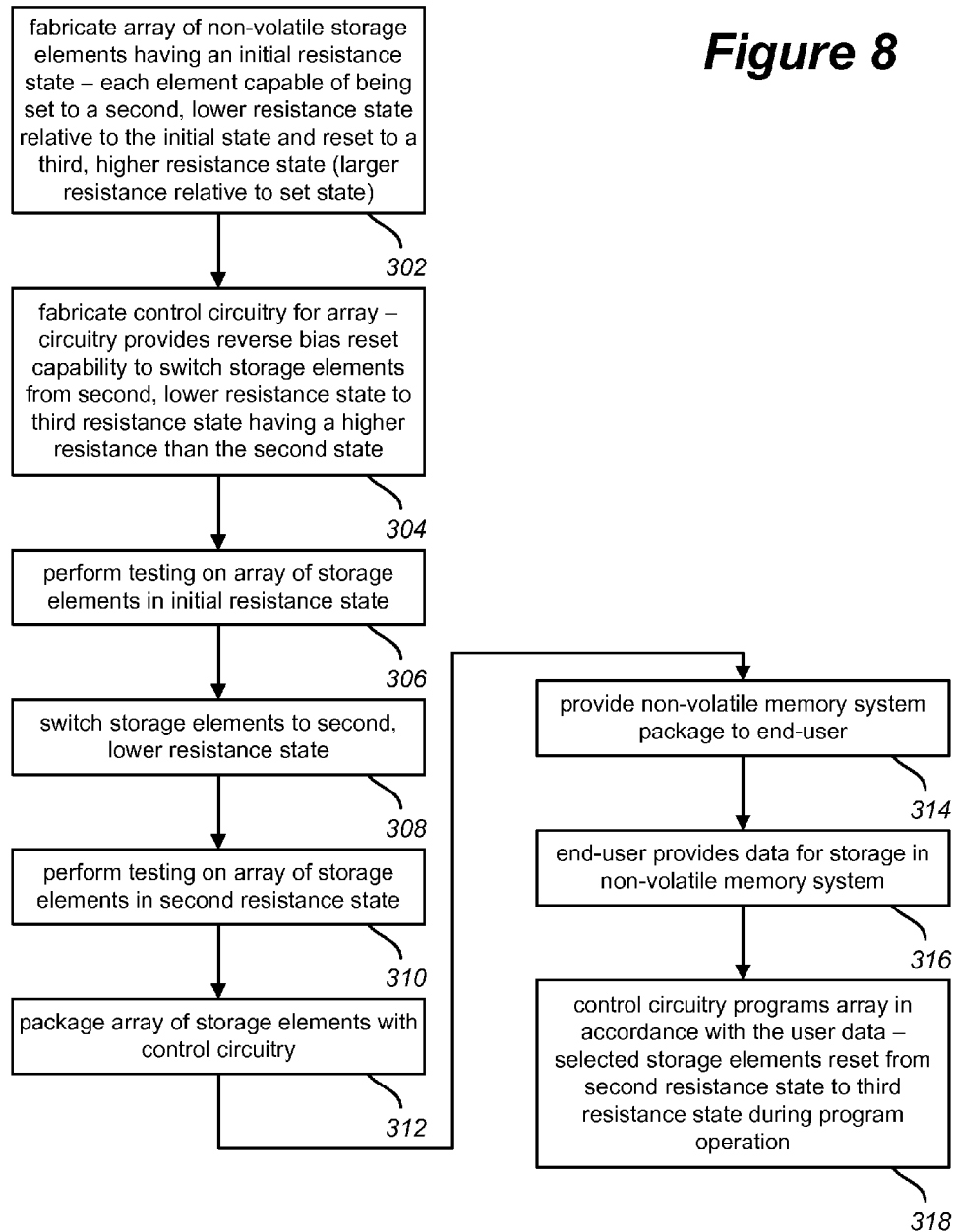

selected WL selected BL selected WL selected BL

HIGH BANDWIDTH ONE TIME FIELD-PROGRAMMABLE MEMORY

CROSS-REFERENCE TO RELATED APPLICATIONS

The following related applications, filed on even date herewith, are cross-referenced and incorporated by reference herein in their entirety:

U.S. patent application Ser. No. 11/461,393, entitled "Controlled Pulse Operations in Non-Volatile Memory," filed concurrently;

U.S. patent application Ser. No. 11/461,399, entitled "Systems for Controlled Pulse Operations in Non-Volatile Memory," filed concurrently;

U.S. patent application Ser. No. 11/461,419, entitled "Systems For High Bandwidth One Time Field-Programmable Memory," by Roy E. Scheuerlein and Christopher J. Petti;

U.S. patent application Ser. No. 11/461,424, entitled "Reverse Bias Trim Operations in Non-Volatile Memory," by Roy E. Scheuerlein and Tanmay Kumar;

U.S. patent application Ser. No. 11/461,431, entitled "Systems for Reverse Bias Trim Operations in Non-Volatile Memory," by Roy E. Scheuerlein and Tanmay Kumar;

U.S. patent application Ser. No. 11/461,986, entitled "Method for Using a Memory Cell Comprising Switchable Semiconductor Memory Element With Trimmable Resistance," by Tanmay Kumar, S. Brad Herner, Roy E. Scheuerlein, and Christopher J. Petti;

U.S. patent application Ser. No. 11/496,985, entitled "Multi-Use Memory Cell and Memory Array," by Roy E. Scheuerlein and Tanmay Kumar;

U.S. patent application Ser. No. 11/496,984, entitled "Method for Using a Multi-Use Memory Cell and Memory Array," by Roy E. Scheuerlein and Tanmay Kumar;

U.S. patent application Ser. No. 11/496,874, entitled "Mixed-Use Memory Array," by Roy E. Scheuerlein;

U.S. patent application Ser. No. 11/496,983, entitled "Method for Using a Mixed-Use Memory Array," by Roy E. Scheuerlein;

U.S. patent application Ser. No. 11/496,870, entitled "Mixed-Use Memory Array with Different Data States," by Roy E. Scheuerlein and Christopher J. Petti;

U.S. patent application Ser. No. 11/497,021, entitled "Method for Using a Mixed-Use Memory Array with Different Data States," by Roy E. Scheuerlein and Christopher J. Petti;

U.S. patent application Ser. No. 11/461,339 entitled "Passive Element Memory Array Incorporating Reversible Polarity Word Line and Bit Line Decoders," by Luca G. Fasoli, Christopher J. Petti, and Roy E. Scheuerlein;

U.S. patent application Ser. No. 11/461,364 entitled "Method for Using a Passive Element Memory Array Incorporating Reversible Polarity Word Line and Bit Line Decoders," by Luca G. Fasoli, Christopher J. Petti, and Roy E. Scheuerlein;

U.S. patent application Ser. No. 11/461,343 entitled "Apparatus for Reading a Multi-Level Passive Element Memory Cell Array," by Roy E. Scheuerlein, Tyler Thorp, and Luca G. Fasoli;

U.S. patent application Ser. No. 11/461,367 entitled "Method for Reading a Multi-Level Passive Element Memory Cell Array," by Roy E. Scheuerlein, Tyler Thorp, and Luca G. Fasoli;

U.S. patent application Ser. No. 11/461,352 entitled "Dual Data-Dependent Busses for Coupling Read/Write Circuits to a Memory Array," by Roy E. Scheuerlein and Luca G. Fasoli;

U.S. patent application Ser. No. 11/461,369 entitled "Method for Using Dual Data-Dependent Busses for Coupling Read/Write Circuits to a Memory Array," by Roy E. Scheuerlein and Luca G. Fasoli;

U.S. patent application Ser. No. 11/461,359 entitled "Memory Array Incorporating Two Data Busses for Memory Array Block Selection," by Roy E. Scheuerlein, Luca G. Fasoli, and Christopher J. Petti;

U.S. patent application Ser. No. 11/461,372 entitled "Method for Using Two Data Busses for Memory Array Block Selection," by Roy E. Scheuerlein, Luca G. Fasoli, and Christopher J. Petti;

U.S. patent application Ser. No. 11/461,362 entitled "Hierarchical Bit Line Bias Bus for Block Selectable Memory Array," by Roy E. Scheuerlein and Luca G. Fasoli; and U.S. patent application Ser. No. 11/461,376 entitled "Method for Using a Hierarchical Bit Line Bias Bus for Block Selectable Memory Array," by Roy E. Scheuerlein and Luca G. Fasoli.

BACKGROUND OF THE INVENTION

1. Field of the Invention

Embodiments in accordance with the present disclosure are directed to integrated circuits containing non-volatile memory cell arrays and particularly those arrays incorporating passive element memory cells.

2. Description of the Related Art

Materials having a detectable level of change in state, such as a resistance or phase change, are used to form various types of non-volatile semiconductor based memory devices. For example, simple anti-fuses are often used for binary data storage in one time field programmable (OTP) memory arrays by assigning a lower resistance initial physical state of a memory cell to a first logical state such as logical '0,' and assigning a higher resistance physical state of the element to a second logical state such as logical '1.' Other logical data assignments to physical states may also be used. Some materials can be reset back to a higher resistance state after being set from an initial state to a lower resistance state. These types of materials can be used to form re-writable memory cells. Multiple levels of detectable resistance in materials can further be used to form multi-state devices which may or may not be re-writable.

Materials having a memory effect such as a detectable level of resistance are often placed in series with a steering element to form a memory device. Diodes or other devices having a non-linear conduction current are typically used as the steering element. In many implementations, a set of word lines and bit lines are arranged in a substantially perpendicular configuration with a memory cell at the intersection of each word line and bit line. Two-terminal memory cells can be constructed at the intersections with one terminal (e.g., terminal portion of the cell or separate layer of the cell) in contact with the conductor forming the respective word line and another terminal in contact with the conductor forming the respective bit line.

In some cases, the bias conditions during read and write operations are an important consideration when implementing non-volatile memory arrays having passive element memory cells comprising switchable resistance materials or phase change materials as the state change element. High bias conditions applied to program these cells can restrict the endurance of the steering element. High leakage currents, program disturbances, read disturbances, etc. can pose difficulties when attempting to produce a memory device comprising one or more arrays of passive element memory cells that can be reliably fabricated, programmed, and read. These factors often limit system performance by reducing the number of cells that can be simultaneously addressed in order to keep leakage currents at acceptable levels, for example. Such limitations on bandwidth may prove unacceptable in certain applications.

SUMMARY OF THE INVENTION

A one-time field programmable (OTP) memory cell with related manufacturing and programming techniques is disclosed. An OTP memory cell in accordance with one embodiment includes at least one resistance change element in series with a steering element. The memory cell is field programmed using a reverse bias operation that can reduce leakage currents through the array as well as decrease voltage levels that driver circuitry must normally produce in program operations. An array of memory cells can be fabricated by switching the memory cells from their initial virgin state to a second resistance state during the manufacturing process. In one embodiment, the factory switching operation can include popping an anti-fuse of each memory cell to set them into the second resistance state. The array of memory cells in the second resistance state are provided to an end-user. Control circuitry is also provided with the memory array that can switch the resistance of selected cells back toward their initial resistance state to program the array in accordance with data received from a user or host device.

In one embodiment, a method of forming one-time field-programmable non-volatile storage is provided. The method includes forming an array of non-volatile memory cells that include at least one resistance change element and switching memory cells of at least a portion of the array from an initial resistance state to a second resistance state during manufacturing by changing a resistance of the at least one resistance change element. The second resistance state corresponds to an unprogrammed state of memory cells of the array. The method further includes providing circuitry in communication with the array to program the memory cells in accordance with user data by switching selected memory cells to a third resistance state corresponding to a programmed state of memory cells of the array. Switching the selected cells can include applying a reverse bias to the selected memory cells to change a resistance of the at least one resistance change element.

In one embodiment, a non-volatile memory system is provided that includes a plurality of non-volatile memory cells including an anti-fuse and a resistance change material. The system also includes control circuitry in communication with the plurality of non-volatile memory cells. The anti-fuses of the memory cells include a substantially non-conductive state and a substantially conductive state and are set from the substantially non-conductive state to the substantially conductive state during manufacturing of the non-volatile memory system to form a first resistance state for each of the memory cells. The control circuitry can receive a request to program the plurality of non-volatile memory cells in accordance with user data and in response, reset selected memory cells of the plurality from the first resistance state to a second resistance state by applying a reverse bias to the selected memory cells to increase a resistance of the resistance change material.

BRIEF DESCRIPTION OF THE DRAWINGS

FIG. 6 is a graph depicting the distributions of resistance for the resistance states of a one-time field programmable memory in accordance with one embodiment.

FIG. 7 is a table summarizing the various resistance states of a one-time field programmable memory array in accordance with one embodiment.

FIG. 8 is a flowchart of a method for manufacturing and programming a one-time field programmable memory array.

DETAILED DESCRIPTION

Figure 1:
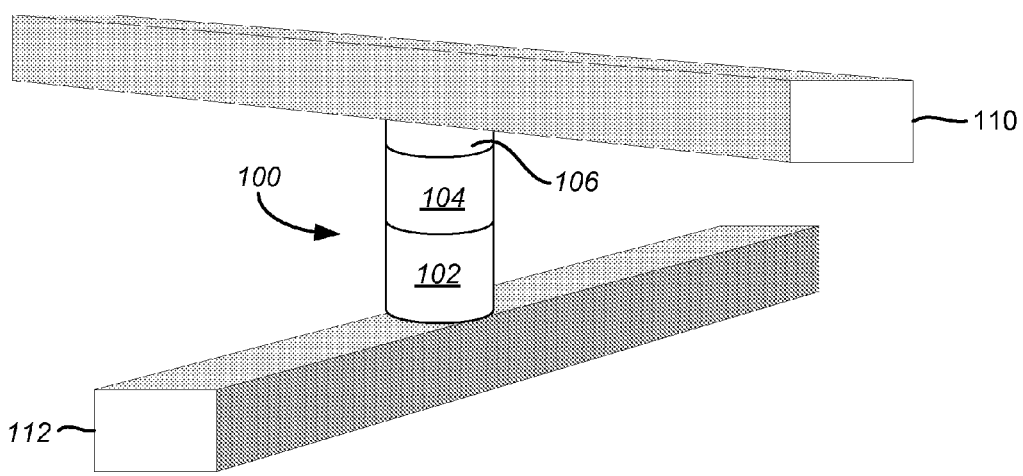
FIG. 1 depicts an exemplary non-volatile memory cell in accordance with one embodiment.

FIG. 1 depicts an exemplary structure for a non-volatile memory cell that can be used in accordance with embodiments of the present disclosure. A two-terminal memory cell 100 as depicted in FIG. 1 includes a first terminal portion connected to a first conductor 110 and a second terminal portion connected to a second conductor 112. The memory cell includes a steering element 102 in series with a state change element 104 and an anti-fuse 106 to provide non-volatile date storage. The steering element can take the form of any suitable device exhibiting a nonlinear conduction current characteristic such as a simple diode. The state change element will vary by embodiment and can include numerous types of materials to store data through representative physical states. State change element 104 can include resistance change materials, phase change resistive materials, etc. For example, a semiconductor or other material having at least two levels of detectable resistance change (e.g., low to high and high to low) is used in one embodiment to form a passive storage element 100. By assigning logical data values to the various levels of resistance that can be set and read from resistance change element 104, memory cell 100 can provide reliable data read/write capabilities. Anti-fuse 106 can further provide resistance state change abilities that can be exploited for non-volatile data storage. An anti-fuse is manufactured in a high resistance state and can be popped or fused to a lower resistance state. An anti-fuse is typically non-conductive in its initial state and exhibits high conductivity with low resistance in its popped or fused state. As a discreet device or element may have a resistance and different resistance states, the terms resistivity and resistivity state are used to refer to the properties of materials themselves. Thus, while a resistance change element or device may have resistance states, a resistivity change material may have resistivity states.

Anti-fuse 106 can provide benefits to memory cell 100 beyond its state change ability. For example, an anti-fuse can serve to set the on-resistance of the memory cell in at an appropriate level relative to the read-write circuitry associated with the cell. These circuits are typically used to pop the anti-fuse and have an associated resistance. Because these circuits drive the voltages and current levels to pop the anti-fuse, the anti-fuse tends to set the memory cell in an appropriate on-resistance state for these same circuits during later operations.

It will be appreciated that other types of two-terminal non-volatile memory cells can be used in embodiments. For example, one embodiment does not have an anti-fuse 106 and merely includes state change element 104 and steering element 102. Other embodiments may include additional state change elements in place of or in addition to the anti-fuse. Various types of suitable memory cells are described in U.S. Pat. No. 6,034,882 entitled "Vertically Stacked Field Programmable Non-volatile Memory and Method of Fabrication." Various other types of cells may be used, including those described in U.S. Pat. No. 6,420,215 and U.S. patent application Ser. No. 09/897,705 entitled "Three-Dimensional Memory Array Incorporating Serial Chain Diode Stack" filed on Jun. 29, 2001, and U.S. patent application Ser. No. 09/560,626 entitled "Three-Dimensional Memory Array and Method of Fabrication" filed on Apr. 28, 2000, all hereby incorporated by reference in their entirety.

A variety of materials exhibit resistivity change behavior suitable for implementing state change element 104 in accordance with embodiments of the present disclosure. Examples of suitable materials for resistance state change element 104 include, but are not limited to doped semiconductors (e.g., polycrystalline silicon, more commonly polysilicon), transition metal oxides, complex metal oxides, programmable metallization connections, phase change resistive elements, organic material variable resistors, carbon polymer films, doped chalcogenide glass, and Schottky barrier diodes containing mobile atoms that change resistance. The resistivity of these materials in some cases may only be switched in a first direction (e.g., high to low), while in others, the resistivity may be switched from a first level (e.g., higher resistance) to a second level (e.g., lower resistance), and then switched back toward the first resistivity level.

A range of resistance values can be assigned to a physical data state to accommodate differences amongst devices as well as variations within devices after set and reset cycling. The terms set and reset are typically used, respectively, to refer to the process of changing an element from a high resistance physical state to a low resistance physical state (set) and changing an element from a low resistance physical state to a higher resistance physical state (reset). Embodiments in accordance with the present disclosure can be used to set memory cells to a lower resistance state or to reset memory cells to a higher resistance state. While specific examples may be provided with respect to set or reset operations, it will be appreciated that these are mere examples and that the disclosure is not so limited.

Conductors 110 and 112 are typically orthogonal to one another and form array terminal lines for accessing an array of memory cells 100. The array terminal lines (also called array lines) at one layer may be termed word lines or X-lines. The array lines at a vertically adjacent layer may be termed bit lines or Y-lines. A memory cell can be formed at the projected intersection of each word line and each bit line, and connected between the respective intersecting word line and bit line as shown for the formation of memory cell 100. A three-dimensional memory array which has at least two levels of memory cells (i.e., two memory planes) may utilize more than one layer of word lines and/or more than one layer of bit lines. A monolithic three dimensional memory array is one in which multiple memory levels are formed above a single substrate, such as a wafer, with no intervening substrates.

Figure 2A:
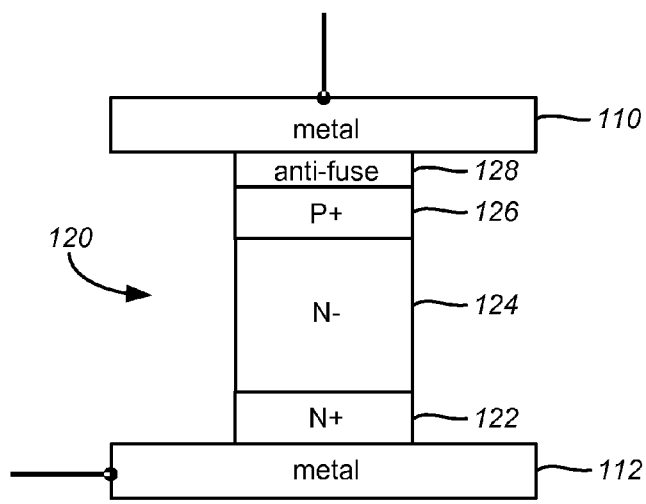
FIGS. 2A and 2B depict exemplary non-volatile memory cells in accordance with one embodiment.
Figure 2B:
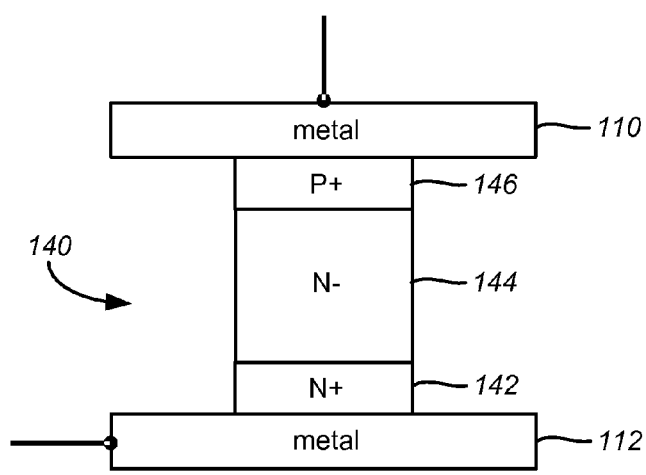

FIGS. 2A and 2B are more detailed depictions of exemplary memory cells that may be used in various embodiments. In FIG. 2A, memory cell 120 is formed between first and second metal conductive layers 110 and 112. The memory cell includes a p-i-n type diode having a heavily doped n-type region 122, intrinsic region 124, and a heavily doped p-type region 126. In other embodiments, region 122 can be p-type and region 126 n-type. Region 124 is intrinsic, or not intentionally doped, though in some embodiments it may be lightly doped. Undoped regions may not be perfectly electrically neutral, resulting from defects, contaminants, etc. that may cause it to behave as if slightly n-doped or p-doped. Such a diode is still considered a p-i-n type diode having an intrinsic middle layer. Other types of diodes such as p-n junction diodes can also be used.

Between doped p-type region 126 and conductor 110 is an anti-fuse 128. Anti-fuse 128 exhibits substantially non-conductive properties in its initial state and substantially conductive properties in its set state. Various types of anti-fuses can be used in accordance with embodiments. In typically fabricated anti-fuses, a large bias applied across the anti-fuse will fuse the forming material causing the anti-fuse to become substantially conductive. This operation is typically referred to as popping the anti-fuse.

Memory cell 120 further includes a state change element that is formed from one or more layers of the diode. It has been discovered that materials used to form the diodes in some memory cells themselves exhibit resistive change abilities. For example, in one embodiment the intrinsic region of the diode is formed of polycrystalline silicon (polysilicon) which has demonstrated abilities to be set from a higher resistivity state to a lower resistivity state, and then reset back to a higher resistivity state from the lower resistivity state. Accordingly, the diode itself may also form the state change element 104 as illustrated in FIG. 1. In other embodiments, one or more additional layers may be included in memory cell 120 to form a state change element as shown in FIG. 1. For example, an additional layer of polysilicon, transition metal oxide, etc. as described above may be included in the cell to provide a state change memory effect. This additional layer may be included between the diode and conductor 112, between the diode and the anti-fuse 128, or between the anti-fuse and conductor 110.

FIG. 2B illustrates a simple memory cell configuration where an anti-fuse 128 is not present. Memory cell 140 simply includes heavily doped n-type region 142, intrinsic region 144, and heavily doped p-type region 146. One or more layers of the diode formed from these regions serves as the memory effect for the cell as described above. Memory cell 140 could also include other layers to form an additional state change element for the cell in one embodiment.

Figure 3A:
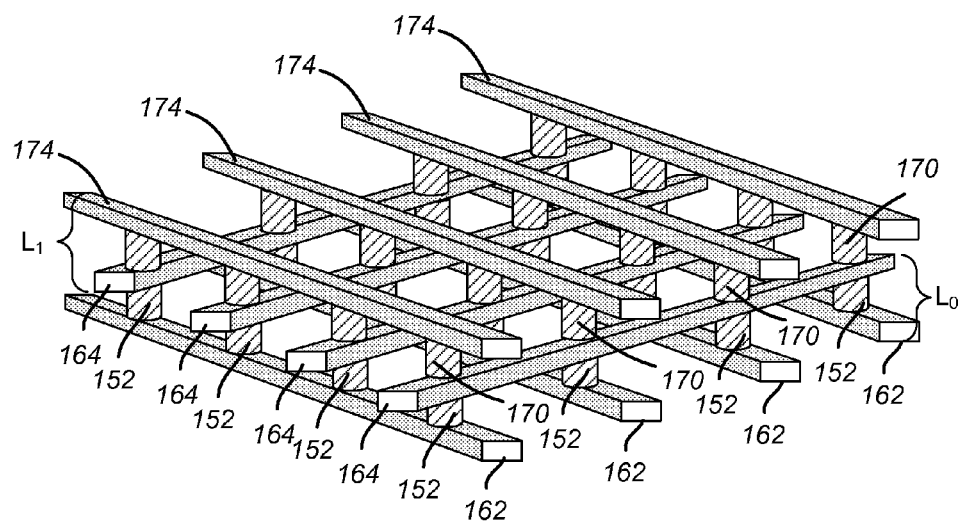
FIGS. 3A and 3B are respective perspective and cross-sectional views of a three-dimensional memory array in accordance with one embodiment.
Figure 3B:
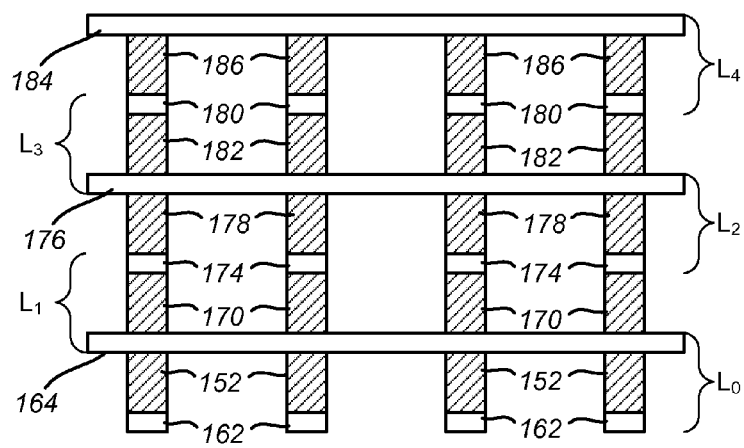

FIGS. 3A-3B depict a portion of an exemplary monolithic three-dimensional memory array as can be used in one embodiment. However, other memory structures can be used in accordance with various embodiments, including two-dimensional memory structures manufactured on, above, or within a semiconductor substrate. Both the word line and bit line layers are shared between memory cells in the structure depicted in the perspective view of FIG. 3A. This configuration is often referred to as a fully mirrored structure. A plurality of substantially parallel and coplanar conductors form a first set of bit lines 162 at a first memory level L0. Memory cells 152 at level L0 are formed between these bit lines and adjacent word lines 164. In the arrangement of FIGS. 3A-3B, word lines 164 are shared between memory layers L0 and L1 and thus, further connect to memory cells 170 at memory level L1. A third set of conductors form the bit lines 174 for these cells at level L1. These bit lines 174 are in turn shared between memory levels L1 and memory level L2, depicted in the cross-sectional view of FIG. 3B. Memory cells 178 are connected to bit lines 174 and word lines 176 to form the third memory level L2, memory cells 182 are connected to word lines 176 and bit lines 180 to form the fourth memory level L3, and memory cells 186 are connected to bit lines 180 and word lines 184 to form the fifth memory level L5. The arrangement of the diodes' polarity and the respective arrangement of the word lines and bit lines can vary by embodiment. Additionally, more or less than five memory levels can be used.

If p-i-n diodes are used as steering elements for the memory cells in the embodiment of FIG. 3A, the diodes of memory cells 170 can be formed upside down relative to the p-i-n diodes of the first level of memory cells 152. For example, if cells 152 include a bottom heavily doped region that is n-type and a top heavily doped region that is p-type, then in the second level of cells 170, the bottom heavily doped region may be p-type while the top heavily doped region is n-type.

In an alternative embodiment, an inter-level dielectric can be formed between adjacent memory levels. No conductors are shared between memory levels. This type of structure for three-dimensional monolithic storage memory is often referred to as a non-mirrored structure. In some embodiments, adjacent memory levels that share conductors and adjacent memory levels that do not share conductors can be stacked in the same monolithic three dimensional memory array. In other embodiments, some conductors are shared while others are not. For example, only the word lines or only the bit lines can be shared in some configurations. A first memory level L0 can include memory cells between a bit line level BL0 and word line level WL0. The word lines at level WL0 can be shared to form cells at a memory level L1 that connect to a second bit line level BL1. The bit line layers are not shared so the next layer can include an interlayer dielectric to separate bit lines BL1 from the next level of conductors. This type of configuration is often referred to as half-mirrored. Memory levels need not all be formed having the same type of memory cell. If desired, memory levels using resistive change materials can alternate with memory levels using other types of memory cells, etc.

In one embodiment as described in U.S. Pat. No. 7,054,219, entitled, "Transistor Layout Configuration for Tight Pitched Memory Array Lines," word lines are formed using word line segments disposed on different word line layers of the array. The segments can be connected by a vertical connection to form an individual word line. A group of word lines, each residing on a separate layer and substantially vertically-aligned (notwithstanding small lateral offsets on some layers), may be collectively termed a row. The word lines within a row preferably share at least a portion of the row address. Similarly, a group of bit lines, each residing on a separate layer and substantially vertically-aligned (again, notwithstanding small lateral offsets on some layers), may be collectively termed a column. The bit lines within a column preferably share at least a portion of the column address.

Figure 4:
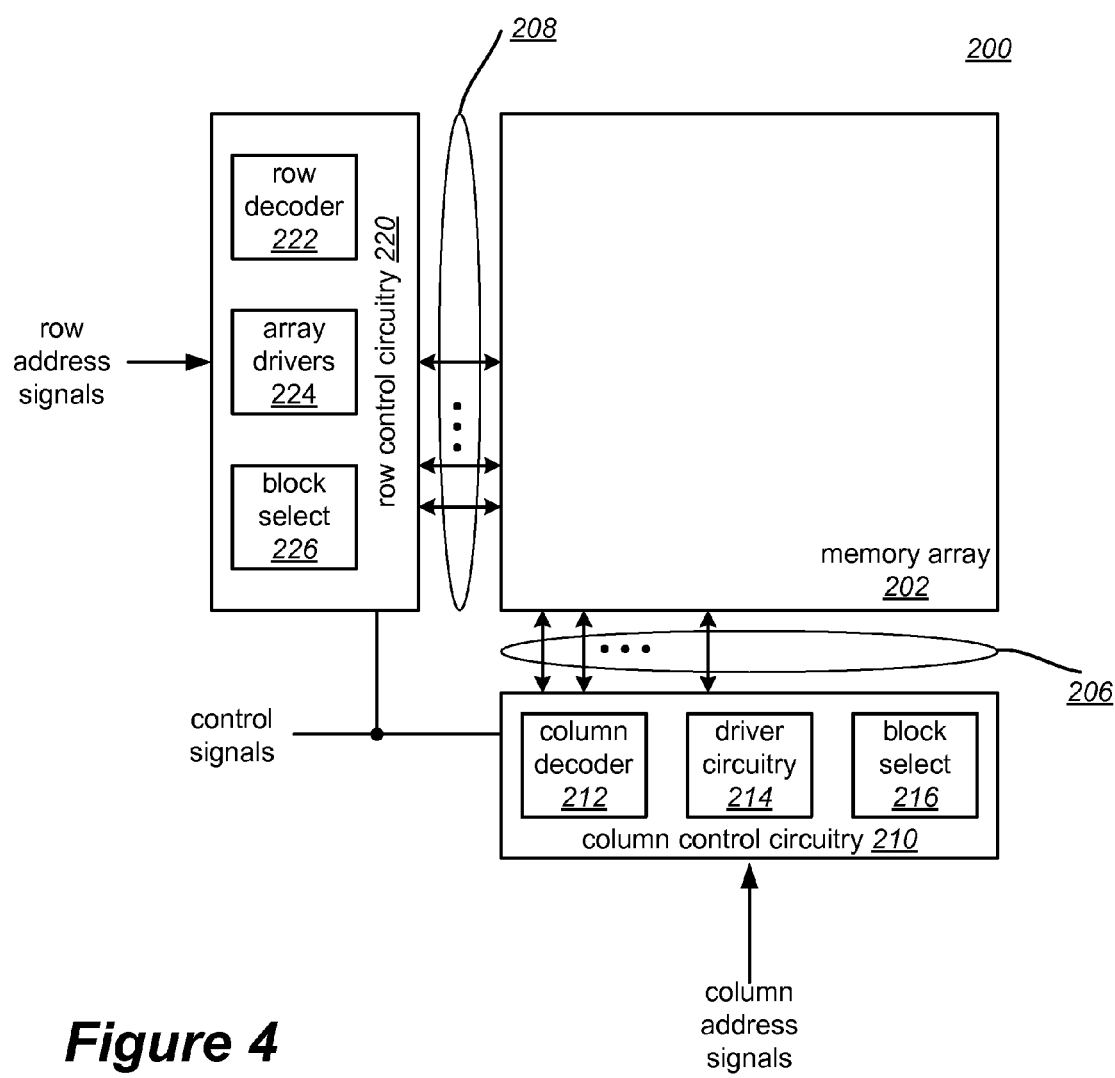
FIG. 4 is block diagram of a non-volatile memory system in accordance with one embodiment.

FIG. 4 is a block diagram of an integrated circuit including a memory array 202. The array terminal lines of memory array 202 include the various layer(s) of word lines organized as rows, and the various layer(s) of bit lines organized as columns. The integrated circuit 200 includes row control circuitry 220 whose outputs 208 are connected to respective word lines of the memory array 202. The row control circuitry receives a group of M row address signals and one or more various control signals, and typically may include such circuits as row decoders 222, array terminal drivers 224, and block select circuitry 226 for both read and write (i.e., programming) operations. The integrated circuit 200 also includes column control circuitry 210 whose input/outputs 206 are connected to respective bit lines of the memory array 202. The column control circuitry 206 receives a group of N column address signals and one or more various control signals, and typically may include such circuits as column decoders 212, array terminal receivers or drivers 214, block select circuitry 216, as well as read/write circuitry, and I/O multiplexers. Circuits such as the row control circuitry 220 and the column control circuitry 210 may be collectively termed control circuitry or array terminal circuits for their connection to the various array terminals of the memory array 202.

Integrated circuits incorporating a memory array usually subdivide the array into a sometimes large number of sub-arrays or blocks. Blocks can be further grouped together into bays that contain, for example, 16, 32, or a different number of blocks. As frequently used, a sub-array is a contiguous group of memory cells having contiguous word and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. Nonetheless, for ease of description, an array may also be used synonymously with sub-array to refer to a contiguous group of memory cells having contiguous word and bit lines generally unbroken by decoders, drivers, sense amplifiers, and input/output circuits. An integrated circuit may include one or more than one memory array.

Biasing arrays of two-terminal memory cells for reading, setting, or resetting states can give rise to program disturbances, read disturbances, as well as high leakage currents that can affect power consumption as well as the reliability of the read and programming operations. For example, when selecting particular memory cells within an array for particular operations, the bias conditions may cause inadvertent leakage currents through unselected memory cells. These leakage currents may be present despite the use of switching elements within the memory array. The diodes of unselected memory cells may conduct small amounts of current when subjected to small positive or negative bias conditions.

Consider a forward bias reset operation implemented in some two-terminal memory arrays as an erase operation, for example. With the steering elements configured from bit line to word line, a large positive bias is created by applying a large voltage to a selected bit line and a low voltage or ground condition to a selected word line. Unselected bit lines may be at a small positive bias and unselected word lines at a large positive bias. With the memory array biased in this manner, unacceptable levels of leakage currents through the half-selected cells along the selected word line or bit line as well as through the unselected cells along an unselected word line and bit line may be present in some cases. Likewise, unacceptable levels of leakage currents may occur during a forward bias set operation as may be used for programming an array of memory cell. The cumulative effect of small leakage currents through unselected cells limits the numbers of selected memory cells that can be operated upon at one time.

It has been discovered that a reverse bias can be applied to memory cells with switching elements and resistance change elements to alter a detectable resistance of the cell. Materials such as metal oxides, polysilicon, etc. described above, can be reset from a lower resistivity state to a higher resistivity state, for example, by subjecting the material to a voltage pulse that creates a reverse bias across the material. A reverse bias is applied during the reset operation in one embodiment to minimize leakage currents through the memory array. An essentially zero bias can be provided to certain unselected memory cells in some implementations. Because the leakage currents are minimized, a larger number of memory cells can be selected for programming. This provides an improvement to operational specifications by decreasing programming times. Moreover, the low leakage currents can facilitate more reliable operations by normalizing device performance within expected levels. U.S. patent application Ser. No. 11/461,339 entitled "Passive Element Memory Array Incorporating Reversible Polarity Word Line and Bit Line Decoders," discloses a reverse bias operation that can be used to minimize leakage currents through unselected and half-selected memory cells.

In one embodiment of the presently disclosed technology, a reset state transition is used for a field-programming operation in a one-time programmable memory array. A memory cell incorporating a resistance change element is factory-set to a lower resistance state than the initial state of the cell. The memory array including the memory cell is then provided to an end-user. The lower resistance state obtained by setting the cell from its higher resistance initial state during manufacturing corresponds to a formatted or unprogrammed state of the cell. Circuitry is provided with the memory array to reset select memory cells to a higher resistance state in accordance with data received from an end-user or host device in communication with the memory cell. Because a reverse bias reset operation is selected for the programming operation, leakage currents are reduced and a more stable device delivered. In one embodiment, the memory cell can be factory switched from a low resistance state to a higher resistance state to define a formatted state of the cell. The circuitry can program the cell using a reverse bias to switch the cell to a lower resistance state.

Figure 5:
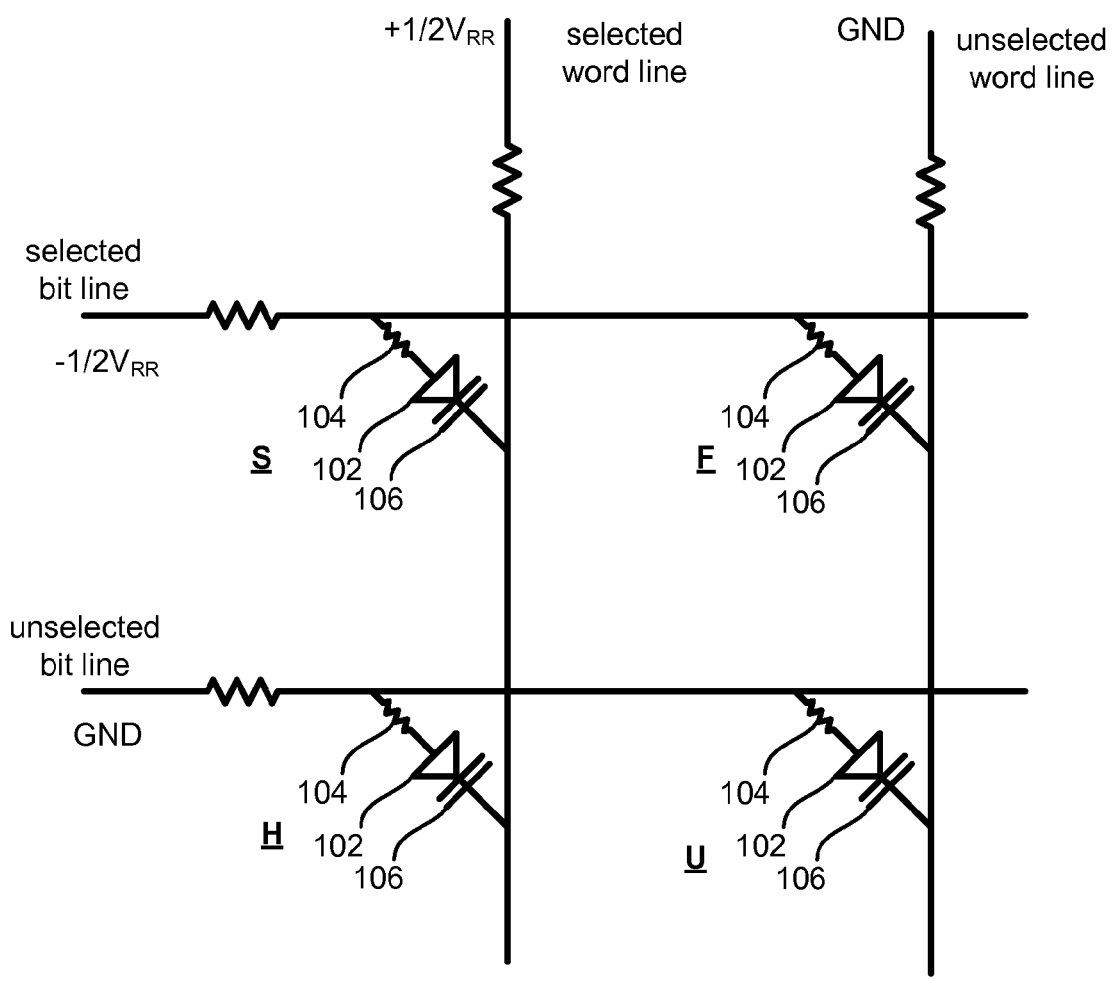
FIG. 5 is a simplified circuit diagram of a memory array illustrating the bias conditions for a reverse bias reset operation in accordance with one embodiment.

FIG. 5 is a circuit diagram of a portion of a memory array during a reverse bias operation in accordance with one embodiment. Although the reverse bias conditions are described with respect to a reset operation, these bias conditions may also be used to set cells to a lower resistance state. One or more selected word lines are at a positive bias and one or more selected bit lines are at a negative bias. For example, the selected word lines may receive a reset voltage signal $V_{WR}$ of $+\frac{1}{2}V_{RR}$, while the selected bit lines are driven at a negative bias of about $-\frac{1}{2}V_{RR}$ through reset voltage signal $V_{BR}$. $V_{RR}$ is the amount of reverse bias (or negative voltage) needed to reset the memory and can vary by embodiment. In one exemplary implementation $V_{RR}$ is about 12V such that the selected word lines receive +6V and the selected bit lines receive −6V to create the 12V reverse bias level. The unselected word lines and bit lines are both grounded during the reset. The steering elements for the selected memory cells (denoted S) are reverse biased, passing a reverse current through the resistance change material for the selected cells. Under this reverse bias condition, the resistance change material switches from a lower resistance state to a higher resistance state to reset the memory cell. The bias conditions depicted in FIG. 5 advantageously provide a zero bias condition for the unselected cells (denoted U). Thus, low leakage currents through unselected and half-selected memory cells during program operations can be achieved. F denotes a half selected memory cell along a selected bit line and H denotes a half-selected memory cell along a selected word line. Additionally, the selected levels of $+/-\frac{1}{2}V_{RR}$ for the selected array lines provide less load on the driver circuitry necessary to generate the voltage level for the reverse bias reset operation. By splitting the bias using positive and negative voltage levels across the array lines, the driver circuitry need only generate half the overall voltage level required in some implementations.

Other bias conditions may also be used to reverse bias the selected memory cells for a reset operation. In one embodiment for example, a positive voltage bias (e.g., $V_{RR}$) can be applied to the selected word line and the selected bit line grounded. The unselected word and bit lines each can receive $+\frac{1}{2}V_{RR}$. This bias scenario will also provide a reverse bias to the selected memory cells that can be used to reset the cells back to a higher resistance state after a set operation. More information regarding reverse bias operations can be found in U.S. patent application Ser. No. 11/461,339 entitled "Passive Element Memory Array Incorporating Reversible Polarity Word Line and Bit Line Decoders."

FIG. 6 is a graph depicting the distribution of resistance for the states of a set of memory cells in a one-time field programmable non-volatile memory system in accordance with one embodiment. A reverse bias reset operation is used for field-programming the device after setting the memory cells to a lower resistance state from their higher resistance initial state during manufacturing as a factory setting. Utilizing a high resistance to low resistance set operation to format an array of OTP memory cells stands in contrast to many memory systems where the initial resistance state of a fabricated device is used as the formatted state. As previously described, other embodiments may include devices that are switched to a high resistance state during manufacturing and programmed under reverse bias to decrease the cell's resistance.

The virgin or initial state of the memory cells is depicted by line 250. The distribution of resistance for these cells when in their initial states after fabrication is shown as a probability function based on the cell's conduction current under a selected voltage bias (e.g., 2V). The virgin state of the cells after fabrication is a higher resistance state, having a conduction current of about $10^{-10}$ A to $10^{-9}$ A under the selected voltage. The memory cells are set from this high resistance state to a lower resistance set state as part of a manufacturing process or vendor setting to facilitate a reset field-programming operation. The lower resistance set state for the non-volatile memory device is depicted by line 252. After formatting, the memory cells have a conduction current of about $10^{-5}$ A.

Memory cells can be set from their highest resistance initial state to this lowest resistance state by popping an anti-fuse in one embodiment. In other embodiments, a resistivity of a resistance change material such as polysilicon or a metal oxide can be switched to set cells into this lower resistance state. In one embodiment, popping an anti-fuse to set devices into a popped state as depicted at line 252 includes applying a large forward bias to the cells, such as about 12V. Other techniques, bias conditions, and/or voltage levels can also be used for these operations. For example, materials such as metal oxides or polysilicon can be set from an initial high resistivity state to a lower resistivity set state during manufacturing to define their formatted state.

During field-programming, a reset operation as described can be used for switching selected memory cells back to a higher resistance state. Line 254 depicts the distribution of resistance for an array of memory cells reset from the lower resistance state 252 to a higher resistance state. The higher resistance state of line 254 exhibits a conduction current of about $10^{-8}$ A. A reverse bias reset operation as described hereinafter can be used in one embodiment to reset the resistance of the memory cells from state 252 to state 254. For example, the resistivity of a resistivity change material in each cell can be increased by subjecting the memory cells to a reverse bias voltage on the order of about −10V to −12V in one embodiment.

By setting each memory cell to a lower resistance state during the manufacturing process, a one-time field programmable memory array can be provided that includes a reverse bias reset operation for programming. Utilizing the reverse bias reset operation as described, leakage currents can be reduced and improved bandwidth for programming operations achieved. More cells can be selected than in traditional OTP arrays due to the low leakage currents associated with the reverse biased array.

FIG. 7 is a table summarizing the resistance states used for data storage in an OTP memory of one embodiment. The initial physical state of the cell is not used for logical data storage and thus, is assigned no data value in logical state column 260. No physical state transition 264, corresponding bias conditions 266, or location 268 are associated with the initial state as it is the virgin state resulting from fabrication. The formatted state of each cell results from switching the cell from its highest resistance initial state to the lowest resistance state using a set operation. The resulting formatted or unprogrammed state of the device may be assigned logical data '1' in one embodiment, although other codings can be used.

The bias conditions for the set operation can include a large forward bias (e.g., +12V) to pop an anti-fuse in one embodiment. In other embodiments, other resistance changes may be used as well as different bias conditions such as a reverse bias set operation. Column 268 shows that the set operation is a factory or vendor operation performed before providing the formatted device to a user (or after re-formatting at a vendor or factory after the device has been cycled). It is therefore possible in one embodiment to provide incomplete circuitry with the memory system for setting the device to a lower resistance state. For example a charge pump for generating the high voltage of, e.g. +12 volts, can be avoided by supplying externally a high voltage during factory setting. In some implementations, set operations require larger voltage biases and/or longer operational times than reset operations to higher resistance states. Accordingly, simpler circuitry may be required. Other embodiments may include circuitry for setting the device.

The programmed sate of the cell is assigned logical '0' in one embodiment and results from resetting the cell to a higher resistance state after factory setting it to a lower resistance state. A reverse bias reset operation can be used in one embodiment to achieve the benefits previously described, including low leakage currents and the lower applied voltage levels of $+/-\frac{1}{2}V_{RR}$. A resistivity change material such as polysilicon, metal oxide, etc. is used in one embodiment for the resistance change associated with the programming operation. Importantly, the programmed state is a field programmable state that can be achieved using the reverse bias reset operation because a set operation was first performed to format the memory cells. The on-board circuitry required for the reverse bias reset operation may be simpler than circuitry required in other devices.

FIG. 8 is a flowchart of a method for manufacturing and programming a one-time field programmable memory array utilizing a reverse bias reset operation for programming. At step 302, an array of non-volatile storage elements is fabricated. Resistance change memory cells are used in one embodiment that are capable of being set from a virgin high resistance state to a lower resistance set state and then being reset to a higher resistance state. In another embodiment, cells that are switched from a virgin low resistance state to a higher resistance state can be used. The higher resistance state may have a lower resistance than the initial state in one embodiment. At step 304, control circuitry is fabricated for the memory array. The circuitry can reset the memory cells from the lower resistance set state to the higher resistance reset state. In one embodiment, the circuitry is not capable of setting the memory cells from a higher resistance state to a lower resistance state.

At step 306, the array of non-volatile storage elements and/or control circuitry can undergo testing with each memory cell in its initial state. Testing may check for defective memory cells in the array, for example, by reading or writing to memory cells, as well as defects in the control or support circuitry for the array. Testing may check for shorts between word lines or between bit lines, etc. Defective portions of the array may be replaced with redundant memory cells or mapped out of the array using known techniques. At step 308, the storage elements are switched from their high resistance initial states to lower resistance formatted states. The memory cells can undergo additional testing at step 310 after being set to the lower resistance state. This testing may detect defects that were masked during the previous tests or that arose as a result of setting the cells to their lower resistance states. For example, popping an anti-fuse may cause shorts in the array due to the sometimes violent reactions that take place and high voltage levels used. The array is packaged with the control circuitry at step 312. In some embodiments, including monolithic three-dimensional memories, the control circuitry and memory array will be fabricated on the same substrate. Step 312 can include the formation of a memory package that includes more than one array and more than one set of control circuitry.

At step 314, the packaged device is provided to an end-user. The end user uses the memory device to store data at step 316. For example, the end user may use a host device that is in communication with the memory device to provide data for storage in the memory cells. The control circuitry for the memory system will program the user data at step 318. The control circuitry resets select cells from the low resistance formatted state to a higher resistance programmed state using a reverse bias reset operation. For example, the control circuitry may reset select cells to represent logical data '0' while leaving other cells in the formatted state to represent logical data '1.'

Figure 9A:
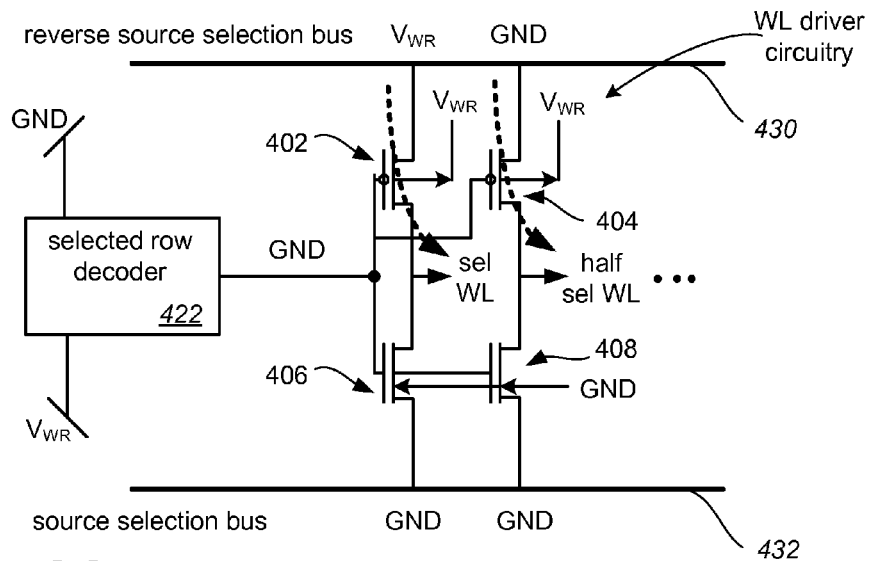
FIGS. 9A and 9B are circuit diagrams of a portion of row control circuitry that can be used in accordance with one embodiment to provide the reverse bias reset conditions of FIG. 5.
Figure 9B:
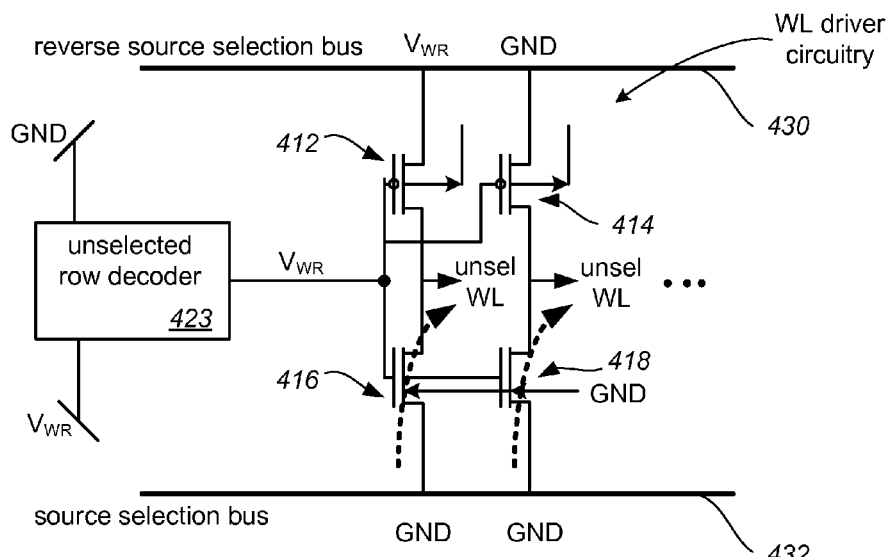

FIG. 9A depicts an embodiment of a portion of row control circuitry 220 that can be used to apply the bias conditions of FIG. 5. While FIGS. 9A-10B describe reverse bias reset operations, this circuitry could be utilized to provide the reverse bias conditions during a set operation as well, for example. Row decoder 422 corresponds to a selected word line during the reset pulse and outputs ground to the NMOS/PMOS word line driver circuitry (e.g., 224 in FIG. 4). The ground input for the driver circuitry turns on the upper PMOS devices 402 and 404. The ground input causes the driver circuitry to pass the reverse source selection bus signals $V_{WR}$ and GND to the selected word line and each half-selected word line associated with decoder 422, respectively. Each row decoder 423 corresponding to an unselected word line outputs $V_{WR}$ to its respective driver circuitry, as depicted in FIG. 9B. The positive bias of $V_{WR}$ turns on the NMOS devices 416 and 418 of the driver circuitry of the unselected word lines. Accordingly, the source selection bus levels (both GND) are selected and driven on each corresponding unselected word line. In one embodiment, the word line reverse reset voltage $V_{WR}$ is equal to about $+\frac{1}{2}V_{RR}$ as previously described. $V_{WR}$ can provide other voltage levels as well. For example, one or more reverse reset voltage pulses having a sloped pulse (e.g., beginning at $+\frac{1}{2}V_{RR}$ and increasing thereafter) as described hereinafter can be provided for the reset operation.

Figure 10A:
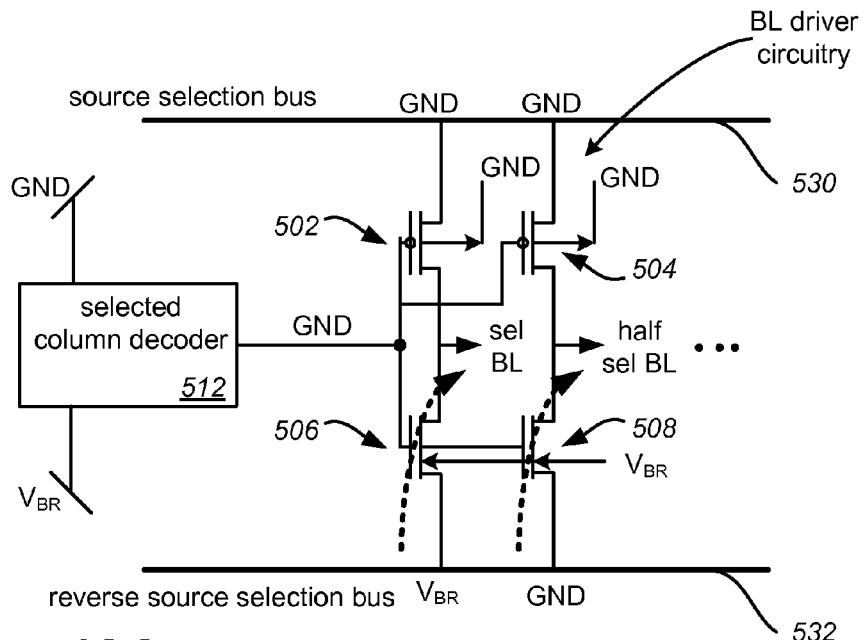
FIGS. 10A and 10B are circuit diagrams of a portion of column control circuitry that can be used in accordance with one embodiment to provide the reverse bias reset conditions of FIG. 5.
Figure 10B:
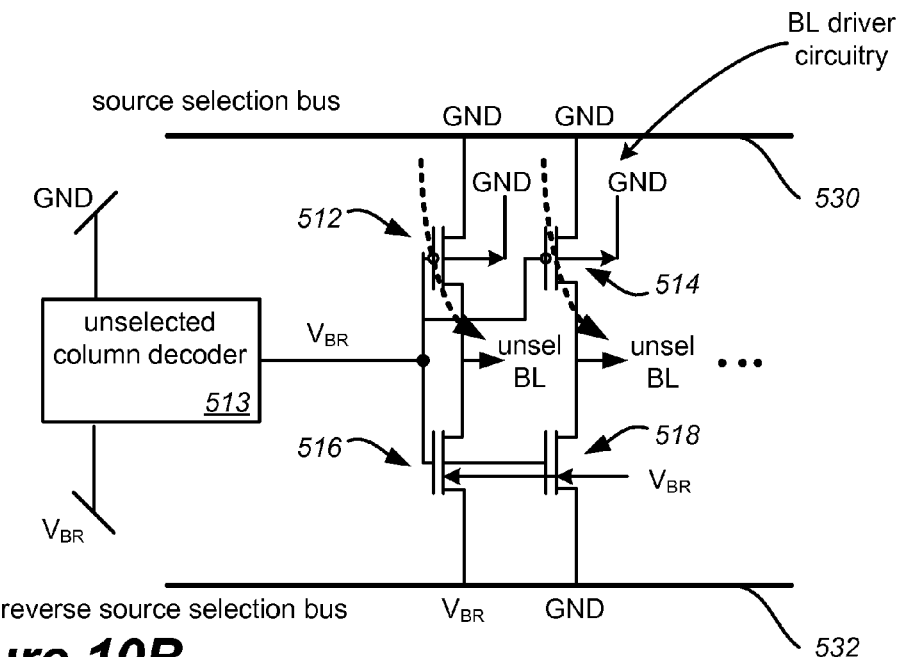

FIGS. 10A and 10B depict circuit diagrams of a portion of column control circuitry 210 that can be used to apply the bias conditions for the reverse reset operation. Column decoder 512 controls a selected bit line driver to provide the selected bit line reset voltage pulse $V_{BR}$. $V_{BR}$ provides a voltage pulse of $-\frac{1}{2}V_{RR}$ in one embodiment. Column decoder 512 can be shared across multiple bit line drivers (e.g., 12) and also connect the half-selected bit lines to ground bias just prior to application of the reset pulses. The half-selected bit lines float near ground during application of the pulse. the large number of unselected cells on half-selected bit lines provide a leakage current that keeps half-selected bit lines near ground. The memory cells sharing a column decoder with the selected bit line may be half-selected memory cells during a reset operation in one embodiment. The cells may connect to the selected word line during the reset operation for example. The selected column decoder 512 outputs GND to the input of the driver circuitry for the column decoder. The GND input at the NMOS/PMOS pair of the driver circuitry will turn on the lower NMOS device 506. The reverse source selection bus level $V_{BR}$ is passed to the selected bit line. Unselected row decoder 513 provides $V_{BR}$ to the gates of its respective driver circuitry, which selects the PMOS devices at the top of each driver pair. The source selection bus signal levels (both at GND) are provided to each unselected word line corresponding to decoder 513.

The driver circuitry associated with the row and column decoders shown in FIGS. 9A-10B may include additional NMOS/PMOS device pairs that form the driver selection circuitry for additional word lines and bit lines. For example, each set of drivers for the row control circuitry may include 16 NMOS/PMOS pairs that connect to 16 different word lines of the array and are associated with a single row decoder. Each set of drivers for the column control circuitry may include 12 NMOS/PMOS pairs that connect to 12 different word lines of the array and are associated with a single column decoder. This configuration is exemplary and others may be used in accordance with embodiments. Such a configuration as described, however, can advantageously provide a reasonable fan out of the array lines at each memory level. It also facilitates placement of the driver circuitry on the same pitch as the array lines with which it is associated. In addition to accommodating the large number of array lines, this arrangement can avoid long transmission of the various driver voltage levels to the array and consequently improve power performance. More details regarding driver and control circuitry for controlling a memory array, including a dual bus architecture suitable for implementing data dependent selection of both selected and unselected word and/or bit lines in one embodiment, can be found in U.S. patent application Ser. No. 11/461,352 entitled "Dual Data-Dependent Busses for Coupling Read/Write Circuits to a Memory Array," by Roy E. Scheuerlein and Luca G. Fasoli.

Differences in device characteristics can affect the erase behavior of individual memory cells within memory array 202 during reverse reset operations as just described. Memory cells may have different dimensions that result from the fabrication process. The material compositions, for example polysilicon material, between devices may lack certain uniformity. This can result in some cells that may reset at a lower voltage bias while other cells may reset at a higher voltage bias, when compared with the nominal level of an average cell in the array. To adequately reset an array of memory cells in accordance with one embodiment of the present disclosure, including variances among individual memory cells, at least one voltage pulse applied to the selected memory cells of the array during a reset operation has an amplitude with a changing slope to gradually increase the reverse bias applied to the selected memory cells. Cells requiring a larger reset voltage level will reset at the higher reverse bias after the amplitude of the voltage pulse has changed while cells only requiring a lower reset voltage level will reset at a smaller level of reverse bias. This technique accommodates variances between devices while also providing an efficient process that will not damage the devices being reset. Because a single reset voltage pulse can be applied to create a range of reverse bias reset conditions, time-consuming verify operations are avoided or minimized. The single pulse can be applied across each cell while the amplitude changes to increase the reverse bias. Cells that reset at lower values of the reset voltage pulse will automatically turn-off when they reset to the higher resistance state. The higher resistance after reset will decrease or stop the current flow through these devices, ensuring that they are not damaged by the higher values of reset voltage. In one embodiment, two pulses of opposite polarity are simultaneously applied to a memory cell and each may or may not include a sloped pulse.

Figure 11A:
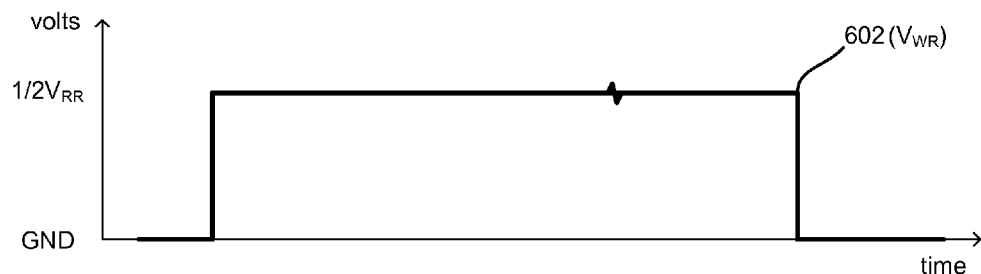
FIGS. 11A and 11B depict exemplary bit line and word line reset voltage signals in accordance with one embodiment for generating an increasing reverse bias during reset operations.
Figure 11B:
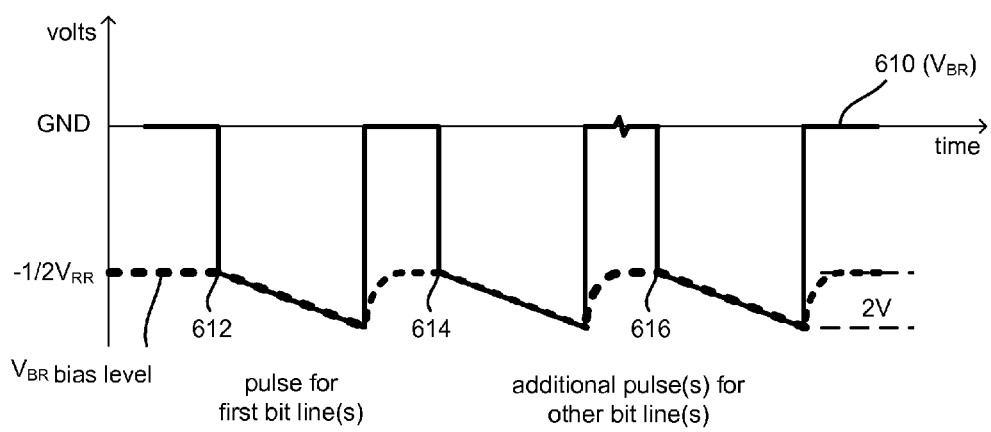

FIGS. 11A-11B depict reset voltage signals in accordance with one embodiment that can be applied to selected word lines and bit lines, respectively, during a reverse bias operation as shown in FIG. 5. A word line reset voltage signal $V_{WR}$ is depicted in FIG. 11A that rises to a maximum value of about $+\frac{1}{2}V_{RR}$ (e.g., +6V) for the duration of the portion of the operation depicted. A bit line reset voltage signal $V_{BR}$ is depicted in FIG. 11B having a starting value of $-\frac{1}{2}V_{RR}$ for each reset voltage pulse. The reset signal on the bit line has an amplitude that changes according to a substantially constant slope. In FIG. 7B, the bit line reset voltage signal increases from an initial value of about $-\frac{1}{2}V_{RR}$ to an ending value of about $-(\frac{1}{2}V_{RR}+2V)$. The magnitude of the amplitude for each negative bit line pulse increases by about 2V (to $-8V$ for example) to gradually increase the reverse bias applied across the selected portion of the array. The amplitude of the $V_{BR}$ pulse is limited to the $V_{BR}$ bias level shown by the dotted line in FIG. 11B by the output of a charge pump circuit as shown in FIG. 12B. With the diodes of each memory cell aligned as shown in FIG. 5 from bit line to word line, the constant value of the word line reset voltage signal and the increasing negative voltage of the bit line reset voltage signal increases the reverse bias applied to each memory cell along the selected bit line and selected word line. Multiple pulses are shown for the bit line reset voltage signal as may be used to individually reset smaller portions of the array. For example, a first reset voltage pulse may be applied to one bit line in each of several selected blocks (sub-arrays) and a second pulse applied to a second bit line in each of the several selected blocks. More reset pulses are applied to yet more bit lines until al the data supplied by the user is encoded. This technique may require 16 to 64 or more reset voltage pulses inversely dependent on how many blocks are used to store a page of user data. Other selection and grouping schemes can be used which will require different numbers of reset voltage pulses.

The starting and ending values for $V_{BR}$ can vary by implementation. In one embodiment, statistical data or experimentation is used to select the optimal starting and ending values for each pulse. For example, the initial value of the pulse may be chosen to create a reverse bias determined to be the minimum any cell will need before resetting from the lower resistance state to the higher resistance state. The ending value of each pulse may be chosen to create the largest reverse bias typically needed to reset any cell of the array. By gradually applying an increasing reverse bias, the memory cells that reset at a lower reset reverse bias level can avoid being damaged at the increased reverse bias levels. When a memory cell resets to the higher resistance reset state, it will conduct less current and behave in a self-limiting manner. It will turn itself off or stop conducting to a sufficient extent when it has successfully reset. This self-limiting cutoff will avoid damage under the reverse bias conditions. It is noted that gradually increasing the amplitude of a reset pulse from a starting value to a larger ending value to thereby increase the reverse bias for selected memory cells does not have the same electrical effects as applying a constant pulse with a larger starting value. A pulse having a larger starting value may damage the material forming the resistance change element or cause a permanent shift in resistance. Therefore, one embodiment of the disclosed technology utilizes a sloped reverse reset pulse to successfully and safely erase memory cells having different device characteristics.

Figure 12A:
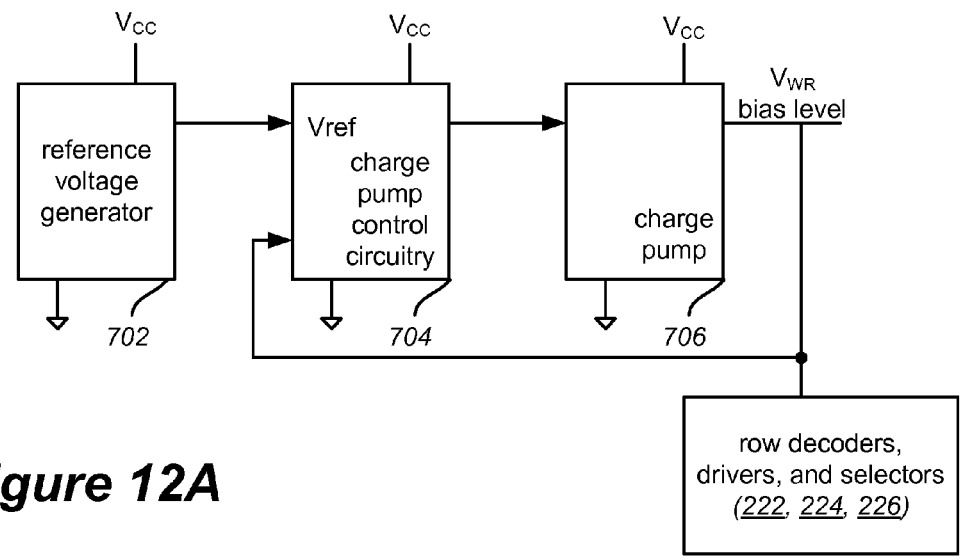
FIGS. 12A and 12B are circuit diagrams for a portion of the control circuitry that can be used to generate sloped pulse reset voltage signals as illustrated in FIGS. 11A and 11B.
Figure 12B:
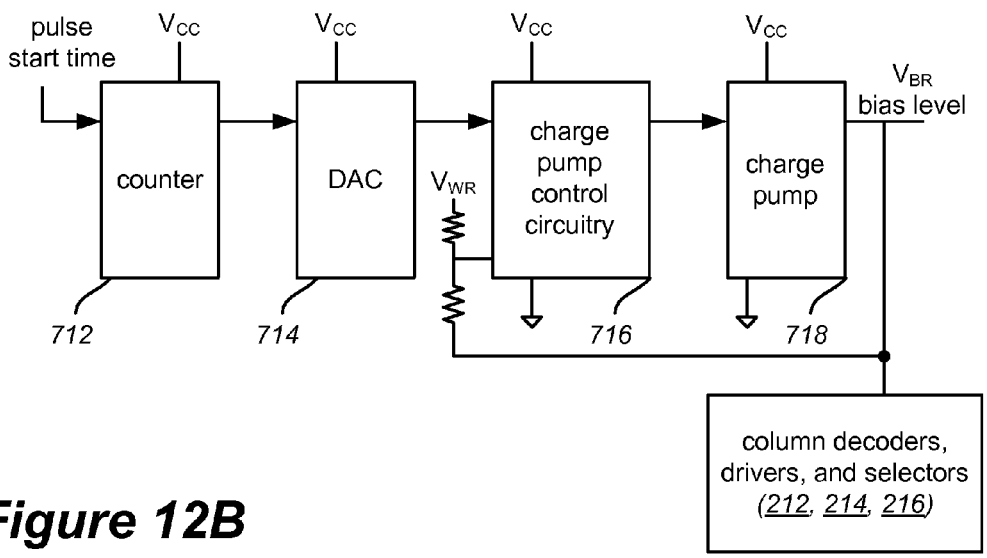

A portion of row control circuitry and column control circuitry that can provide reset voltage signals in one embodiment are depicted in FIGS. 12A and 12B, respectively. A charge pump 706 in FIG. 12A provides the reverse reset $V_{WR}$ bias level through row control circuitry including a reverse source selection bus generator to the reverse source selection bus (e.g., bus 430 in FIGS. 9A-10B) and directly to row decoder circuitry (e.g., decoder 322 in FIG. 4). Reference voltage generator 702 receives a supply voltage $V_{CC}$ and provides a reference voltage $V_{ref}$ to charge pump controller 704. Using a feedback signal from the output of charge pump 706, the controller can provide a starting $V_{WR}$ bias level of about $\frac{1}{2}V_{RR}$ as needed.

The column control circuitry depicted in FIG. 12B utilizes a counter 712 and digital to analog converter 714 to generate the bit line reset voltage $V_{BR}$ bias level having a negative sloped pulse output (negative level and slope). Counter 712 receives a pulse start time and using a clock signal, provides a pulsed input to DAC 714 to generate a analog sloped pulse output. DAC 714 receives the digital input and provides voltage levels to the charge pump controller. Charge pump 718 generates a negative bit line reset voltage $V_{BR}$ bias level that increases according to a substantially constant and negative slope produced from the counter. The amplitude of the negative voltage $V_{BR}$ bias level increases according to the defined slope to gradually increase the reverse bias applied across the memory array.

Figure 13A:
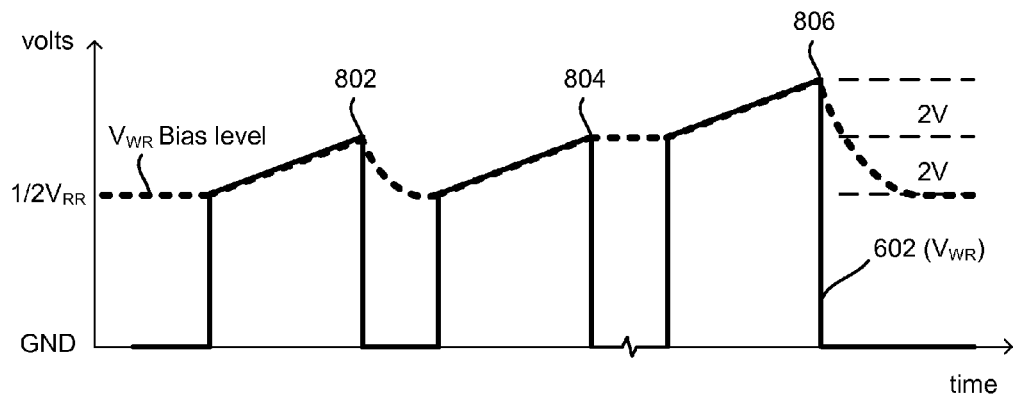
FIGS. 13A and 13B depict other exemplary bit line and word line reset voltage signals in accordance with one embodiment for generating an increasing reverse bias during reset operations.
Figure 13B:
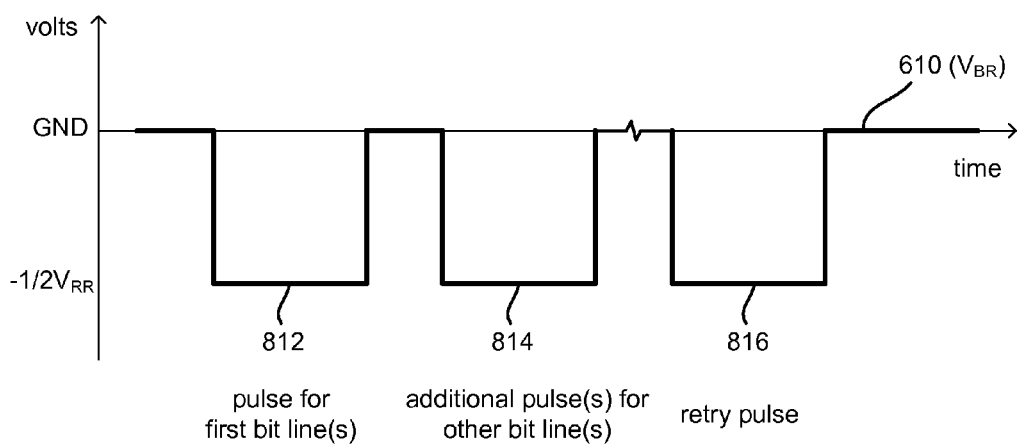

An alternative set of reset voltage signals for applying the reverse bias of FIG. 5 is depicted in FIGS. 13A and 13B. A positive reset voltage pulse $V_{WR}$ is applied to the selected word line(s) and increased according to a positive slope. A negative bit line voltage pulse $V_{BR}$ is applied on the selected bit line(s). Each word line voltage pulse begins at a starting value of about +5V and increases by 2V to around +7V. The magnitude of the $V_{WR}$ pulse is limited to the $V_{WR}$ bias level by the output of the charge pump circuit and is shown by the dotted line in FIG. 11A. The combination of the word line and bit line reset signals will provide an increasing reverse bias across each selected memory cell. Additional bit line reset voltage pulses are depicted as may be used to erase individual groupings of bit lines. As with FIGS. 11A-11B, the pulses of FIGS. 13A-13B can be used to create a forward bias in some embodiments. In another embodiment, the pulses are not sloped. For example, a first voltage pulse having a negative polarity can be applied to a first array line and a second voltage pulse having a positive polarity applied to a second array line to create a reverse bias. This arrangement can also switch the resistance of the memory cells, but does not include a slope on the pulses or a resulting shift in the bias applied. In yet another embodiment, the pulses of FIGS. 11A-11B and FIGS. 13A-13B can be used in a set operation to switch from high resistance to low resistance.

The embodiment of FIGS. 13A and 13B includes a retry technique using a slightly higher reset pulse level determined by the $V_{WR}$ bias level for memory cells that do not reset under application of the initial voltage pulse. For example, the results of resetting a selected portion of the array can be verified after applying the last reset voltage pulses 804 and 814. A verify operation can include reading back the resistive state of the memory cell and comparing it with the predefined level for the reset state. Any columns or bit lines that are not reset can be subjected to a retry pulse at a higher level. The starting value of the word line voltage pulse 806 is increased to 7V and increases to a level of 9V. The value of any retry pulse may vary by embodiment and can be selected based on statistical data and/or testing as previously described. In FIGS. 13A and 13B, the retry pulse is applied to each bit line of the array that fails to verify for a reset state. In other embodiment, a retry pulses (or multiple pulses) can be applied after individual applications of the initial reset voltage pulses. If a column or other grouping of cells fails to verify for the reset resistive state after a retry pulse (or multiple retry pulses) can be handled using error correction control techniques or replaced with redundant memory cells.

Figure 14A:
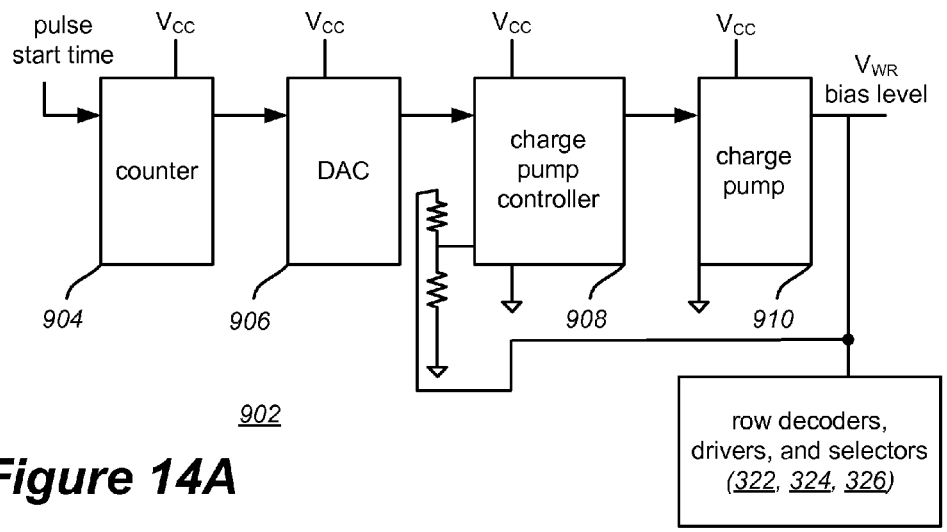
FIGS. 14A and 14B are circuit-level diagrams for a portion of control circuitry that can be used to generate sloped reset pulse signals as illustrated in FIGS. 9A and 9B.
Figure 14B:
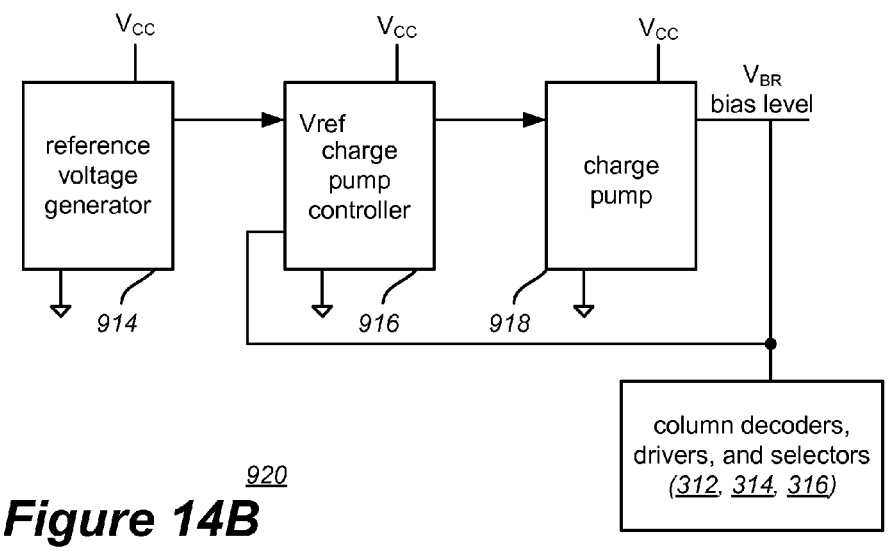

FIGS. 14A and 14B depict portions of the row and column control circuitry that can be used to provide the pulses of FIGS. 13A and 13B in accordance with one embodiment. The selected word lines provide a positive reset signal in this embodiment having an amplitude that increases according to a positive slope. A counter 904 and digital to analog converter 906 are utilized when driving charge pump controller 908. Controller 908 uses the analog output of DAC 906 and creates a positively sloped $V_{WR}$ bias level via charge pump 910. The output of charge pump 910 is applied to the word line decoders and through reverse source selection bus pulse generation circuitry to the reverse source selection bus line. A portion of the column control circuitry 210 for providing the negative $V_{BR}$ bias level is depicted in FIG. 14B. A reference voltage generator 914 delivers a reference voltage $V_{ref}$ to charge pump controller 916. The controller utilizes a feedback loop from the output of charge pump 918 to maintain a steady value of $V_{BR}$ bias level for the bit line reset voltage signal.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method of forming one-time field-programmable non-volatile storage, comprising:
   forming an array of non-volatile memory cells, each including at least one resistance change element;
   switching memory cells of at least a portion of said array from an initial resistance state to a second resistance state during manufacturing by changing a resistance of said at least one resistance change element, said second resistance state corresponding to an unprogrammed state of memory cells of said array; and
   providing circuitry in communication with said array to program said memory cells in accordance with user data by switching selected memory cells to a third resistance state corresponding to a programmed state of memory cells of said array, wherein switching said selected memory cells includes applying a reverse bias to said selected memory cells to change a resistance of said at least one resistance change element.

2. The method of claim 1, wherein said at least one resistance change element includes:
   an anti-fuse forming a first resistance change element; and
   a resistivity change material forming a second resistance change element.

3. The method of claim 2, wherein:
   switching memory cells of at least a portion of said array comprises setting anti-fuses of said at least a portion of said array from a first substantially non-conductive state to a second substantially conductive state; and
   switching said selected memory cells to said third resistance state comprises resetting said selected memory cells to change a resistivity of said resistivity change material from a lower resistivity state to a higher resistivity state.

4. The method of claim 1, wherein:
   said at least one resistance change material includes a resistivity change material;
   switching memory cells of at least a portion of said array comprises setting a resistivity of said resistivity change material from a first resistivity state to a second resistivity state, said second resistivity state of lower resistivity than said first resistivity state; and
   switching said selected memory cells to said third resistance state comprises resetting said resistivity of said resistivity change material from said second resistivity state to a third resistivity state, said third resistivity state of higher resistivity than said second resistivity state.

5. The method of claim 1, wherein:
   switching said selected memory cells by applying a reverse bias includes applying at least one reset voltage pulse having an amplitude that changes to increase an amount of said reverse bias.

6. The method of claim 1, wherein switching memory cells of at least a portion of said array includes decreasing a resistance of said at least one resistance change element.

7. The method of claim 1, wherein switching memory cells of at least a portion of said array includes increasing a resistance of said at least one resistance change element.

8. The method of claim 1, wherein:
   applying a reverse bias to change a resistance of said at least one resistance change element includes increasing said resistance of said at least one resistance change element.

9. The method of claim 1, wherein:
   applying a reverse bias to change a resistance of said at least one resistance change element includes decreasing said resistance of said at least one resistance change element.

10. The method of claim 1, wherein:
    providing circuitry includes providing incomplete circuitry to switch said non-volatile memory cells of said at least a portion of said array from said third resistance state to said second resistance state.

11. The method of claim 1, wherein:
    each of said non-volatile memory cells includes a diode forming a steering element, wherein said diode includes at least one material forming said resistance change element.

12. The method of claim 11, wherein:
    said at least one material is polycrystalline silicon.

13. The method of claim 1, wherein:
    said at least one resistance change element includes a metal oxide resistivity change material.

14. The method of claim 1, wherein:
    said array of non-volatile memory cells is a three-dimensional monolithic memory array.

15. The method of claim 14, wherein:
    said array includes a plurality of word lines and a plurality of bit lines;
    at least one of said plurality of word lines and said plurality of bit lines include individual lines that are shared between memory levels of said three-dimensional array.

16. A method for non-volatile data storage, comprising:
    receiving a request to store user data using a one-time programmable memory including a plurality of non-volatile memory cells, said plurality of non-volatile memory cells are factory-switched to an unprogrammed state by changing a resistance of each memory cell from an initial resistance state to a first detectable resistance state; and
    field-programming said plurality of non-volatile memory cells in accordance with said user data by reverse biasing selected ones of said plurality to switch said selected ones from said first detectable resistance state to a second detectable resistance state corresponding to a programmed state.

17. The method of claim 16, wherein:
    said non-volatile memory cells each include an anti-fuse and a resistivity change material;
    said plurality of non-volatile memory cells are factory-switched to an unprogrammed state by changing a resistance of said anti-fuses of each memory cell; and reverse biasing selected ones of said plurality to switch said selected ones comprises changing a resistivity of said resistivity change material.

18. The method of claim 17, wherein:

each non-volatile memory cell includes a steering element in series with at least one resistance change element.

19. The method of claim 16, wherein:

said plurality of non-volatile memory cells each include a resistivity change material;

said plurality of non-volatile memory cells are factory-switched to an unprogrammed state by changing a resistivity of said resistivity change material from a first resistivity state to a second resistivity state; and field-programming said plurality of non-volatile memory cells comprises changing said resistivity of said resistivity change material from said second resistivity state to a third resistivity state.

20. The method of claim 19, wherein:

said one-time programmable memory is provided without an ability to be switched from said third resistance state to a different resistance state.

21. A method of fabricating non-volatile memory, comprising:

forming an array of non-volatile memory cells including a steering element, an anti-fuse, and a resistivity change material, said forming includes forming each non-volatile memory cell in an initial resistance state;

testing at least a portion of said array with said non-volatile memory cells in said initial resistance state;

factory-switching non-volatile memory cells of said at least a portion of said array from said initial resistance state to a second resistance state;

testing said at least a portion of said array with said non-volatile memory cells in said second resistance state; and providing said array of non-volatile memory cells to an end-user with a one-time field-programmable ability for each memory cell.

22. The method of claim 21, wherein providing said array comprises providing circuitry in communication with said array to program said non-volatile memory cells in accordance with user data by resetting selected memory cells to a third resistance state corresponding to a programmed state of memory cells of said array, said second resistance state corresponds to an unprogrammed state of non-volatile memory cells of said array, said resetting includes applying a reverse bias to said selected memory cells to change a resistance of said at least one resistance change element.

23. The method of claim 21, wherein:

factory-setting non-volatile memory cells of said at least a portion of said array from said initial resistance state to a second resistance state includes changing a resistance of said anti-fuse of each non-volatile memory cell.

24. The method of claim 23, further comprising:

field-programming said array of non-volatile memory cells in accordance with user data by changing a resistivity of said resistivity change material.

\* \* \* \* \*